United States Patent
Yu et al.

(10) Patent No.: US 9,842,823 B2
(45) Date of Patent: Dec. 12, 2017

(54) CHIP-STACKING APPARATUS HAVING A TRANSPORT DEVICE CONFIGURED TO TRANSPORT A CHIP ONTO A SUBSTRATE

(71) Applicant: Taiwan Semiconductor Manufacturing Co., Ltd., Hsin-Chu (TW)

(72) Inventors: Chen-Hua Yu, Hsinchu (TW); HsiaoYun Lo, Hsinchu (TW); Yi-Hsiu Chen, Hsinchu (TW); Wen-Chih Chiou, Zhunan Township (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 14/584,889

(22) Filed: Dec. 29, 2014

(65) Prior Publication Data
US 2016/0190087 A1     Jun. 30, 2016

(51) Int. Cl.
*H01L 23/02* (2006.01)
*H01L 23/48* (2006.01)
*H01L 23/52* (2006.01)
*H01L 29/40* (2006.01)
*H01L 23/00* (2006.01)

(52) U.S. Cl.
CPC ...... *H01L 24/75* (2013.01); *H01L 2224/7501* (2013.01); *H01L 2224/7565* (2013.01); *H01L 2224/75304* (2013.01); *H01L 2224/75305* (2013.01); *H01L 2224/75313* (2013.01); *H01L 2224/75315* (2013.01); *H01L 2224/75318* (2013.01); *H01L 2224/75745* (2013.01);
(Continued)

(58) Field of Classification Search
CPC ............... H01L 24/75; H01L 2224/751; H01L 2224/7555; H01L 2224/75745; H01L 2224/7501; H01L 2224/7565

USPC .................................................. 257/686, 777
See application file for complete search history.

(56) References Cited

U.S. PATENT DOCUMENTS

| | | | | |
|---|---|---|---|---|
| 5,812,409 A | * | 9/1998 | Kanno | H05K 13/0413 324/750.23 |
| 8,048,717 B2 | * | 11/2011 | Liu | H01L 21/6835 438/107 |
| 2012/0126844 A1 | * | 5/2012 | Yasuta | G01R 31/2893 324/756.07 |

FOREIGN PATENT DOCUMENTS

| | | |
|---|---|---|
| JP | 2003-303854 A | 10/2003 |
| JP | 2005-322815 A | 11/2005 |

(Continued)

OTHER PUBLICATIONS

D.-L. Kwong et al., "Vertical Silicon Nanowire Platform for Low Power Electronics and Clean Energy Applications", Hindawi Publishing Corporation, Journal of Nanotechnology, vol. 2012, Article ID 492121, 21 pgs.

*Primary Examiner* — Kimberly Rizkallah
*Assistant Examiner* — Dilinh Nguyen
(74) *Attorney, Agent, or Firm* — Birch, Stewart, Kolasch & Birch, LLP

(57) ABSTRACT

A chip-stacking apparatus for stacking a chip on a substrate is provided. The chip-stacking apparatus includes a substrate support configured to carry the substrate and a transport device configured to dispose a chip to the substrate. The transport device includes a bond head including a bond base and an attaching element disposed on the bond base and configured to allow the chip to be attached thereon. The center area of the attaching element is higher than an edge area of the attaching element relative to the bond base.

19 Claims, 18 Drawing Sheets

(52) U.S. Cl.
CPC ............... *H01L 2224/75753* (2013.01); *H01L 2224/8013* (2013.01); *H01L 2224/80132* (2013.01)

(56) References Cited

FOREIGN PATENT DOCUMENTS

JP    2014-165451 A    9/2014
KR    10-2008-0004464 A    1/2008

\* cited by examiner

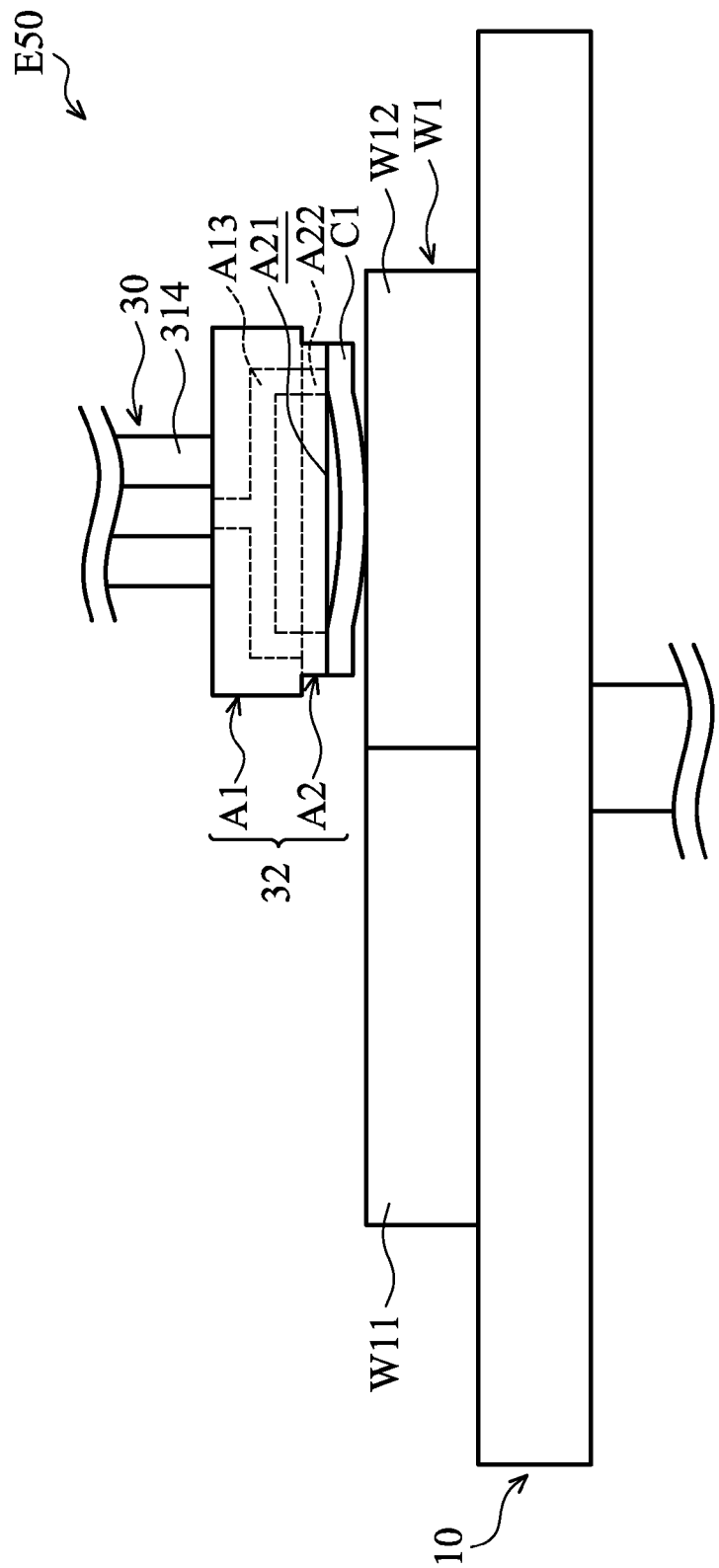

CHIP-STACKING APPARATUS HAVING A TRANSPORT DEVICE CONFIGURED TO TRANSPORT A CHIP ONTO A SUBSTRATE

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a wafer, and patterning the various material layers using lithography to form circuit components and elements thereon. Many integrated circuits are typically manufactured on a single wafer, and individual dies on the wafer are singulated by sawing between the integrated circuits along a scribe line. The individual dies are typically packaged separately, in multi-chip modules, or in other types of packaging, for example.

Recently, a 3D chip stacking technology has been developed. In the 3D chip stacking technology, 3D stacking chips are formed by stacking a number of chips. Although existing devices and methods for 3D chip stacking technology have been generally adequate for their intended purposes, they have not been entirely satisfactory in all respects. Consequently, it would be desirable to provide a solution for improving the 3D chip stacking technology.

BRIEF DESCRIPTION OF THE DRAWINGS

Aspects of the present disclosure are best understood from the following detailed description when read with the accompanying figures. It is noted that, in accordance with standard practice in the industry, various features are not drawn to scale. In fact, the dimensions of the various features may be arbitrarily increased or reduced for clarity of discussion.

FIGS. 6A to 6G are schematic views of the stacking method during intermediate stages.

DETAILED DESCRIPTION

Figure 1:
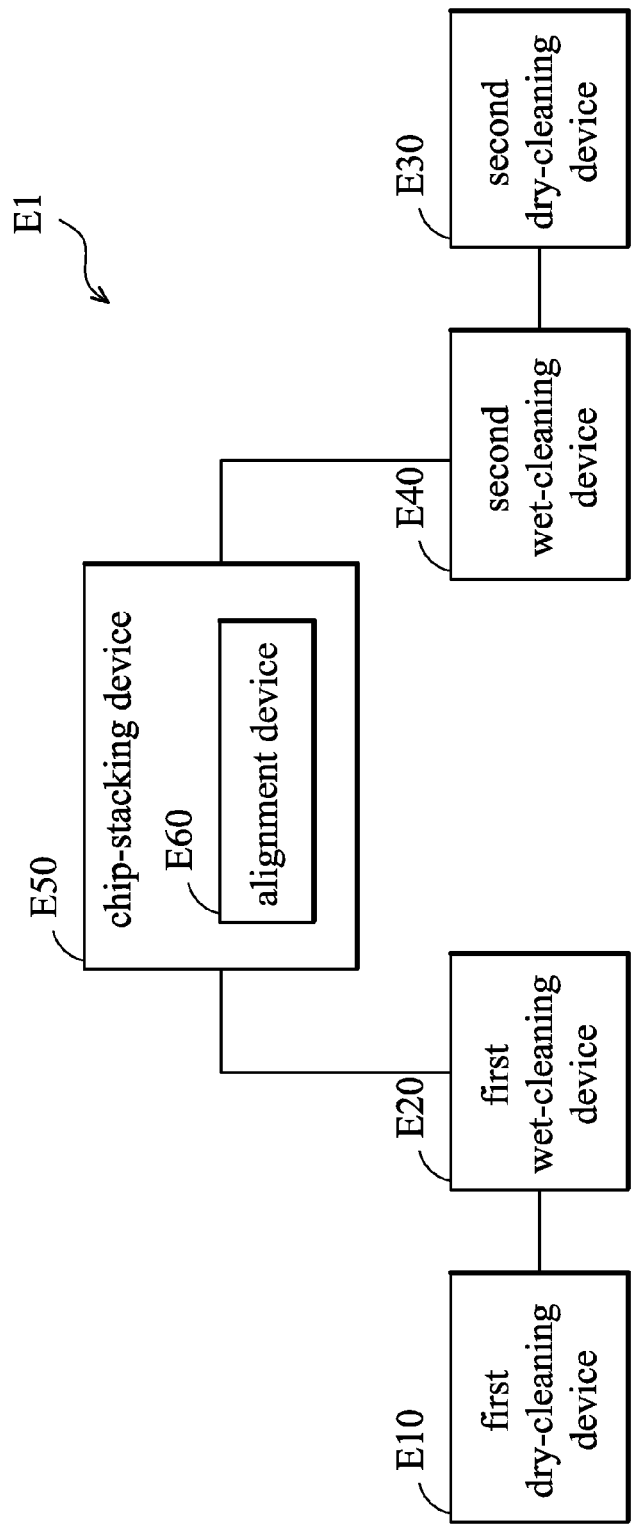
FIG. 1 is a schematic view of a chip-stacking apparatus in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some variations of the embodiments are described. Throughout the various views and illustrative embodiments, like reference numbers are used to designate like elements. It is understood that additional operations can be provided before, during, and after the method, and some of the operations described can be replaced or eliminated for other embodiments of the method.

A chip-stacking apparatus and stacking methods are provided. The chip-stacking apparatus is configured to stack chips on substrates to form 3D stacking chips. Gas bubbles and contaminants between the chips and the substrates are minimized when the chips are stacked on the substrates. Moreover, the alignment of the chips stacked on the substrates is improved.

Figure 2B:
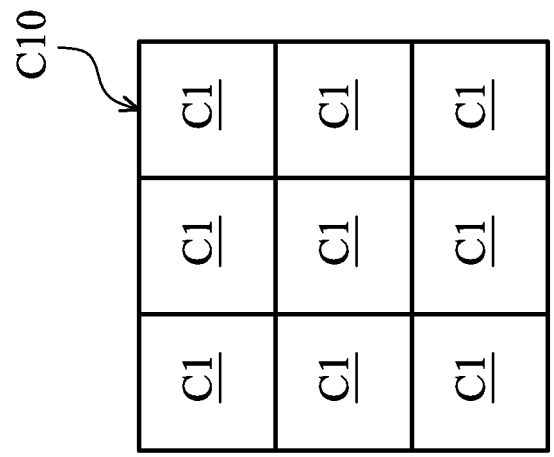
FIG. 2B is a top view of a wafer in accordance with some embodiments of the disclosure.
Figure 2A:
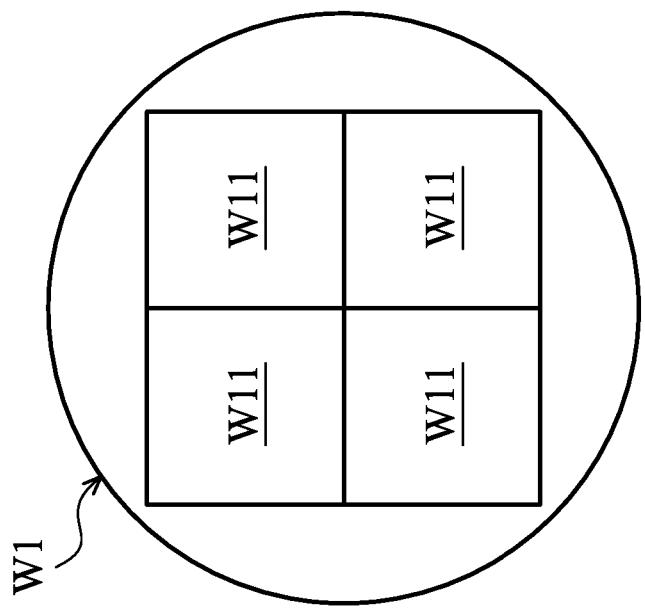
FIG. 2A is a top view of the substrate in accordance with some embodiments of the disclosure.

FIG. 1 is a schematic view of a chip-stacking apparatus E1 in accordance with some embodiments of the disclosure. FIG. 2A is a top view of the substrate W1 in accordance with some embodiments of the disclosure. FIG. 2B is a top view of a wafer W2 in accordance with some embodiments of the disclosure. The chip-stacking apparatus E1 includes a first dry-cleaning device E10, a first wet-cleaning device E20, a second dry-cleaning device E30, a second wet-cleaning device E40, a chip-stacking device E50, and an alignment device E60.

The first dry-cleaning device E10 is configured to clean the substrate W1, as shown in FIG. 2A, using gas or plasma.

In some embodiments, the gas is inert gas, such as $N_2$. In some embodiments, the substrate W1 is a wafer. The substrate W1 includes a number of bottom chips W11. In some embodiments, the substrate W1 is a bottom chip.

In some embodiments, the first dry-cleaning device E10 includes a plasma device. The plasma device is configured to perform a plasma process on the substrate W1. For example, the first dry-cleaning device E10 generates plasma dispense to the surface of the substrate W1 for cleaning the contaminants on the surface of the substrate W1. In some embodiments, the contaminants are particles (such as dust), organic remains, or inorganic remains (such as Metal-Ions). In some embodiments, the contaminants have diameters in a range from about 0.1 um to about 50 um. In some embodiments, the first dry-cleaning device E10 performs the plasma process under low pressure or at atmosphere condition.

After the substrate W1 is cleaned by the first dry-cleaning device E10, the substrate W1 is transported to the first wet-cleaning device E20. The first wet-cleaning device E20 is configured to clean the substrate W1 using liquid. In some embodiments, the first wet-cleaning device E20 dispenses liquid to the surface of the substrate W1 for cleaning the contaminants on the surface of the substrate W1. In some embodiments, the liquid is water, such as deionized water. In some embodiments, the liquid is acid liquid, or alkaline liquid.

In some embodiments, the substrate W1 is cleaned by the first wet-cleaning device E20 first, and then cleaned by the first dry-cleaning device E10. In some embodiments, the first dry-cleaning device E10 is configured to clean the contaminants adhered on the substrate W1 or having a great size. The first wet-cleaning device E20 is configured to clean the contaminants, such as dust, falling on the substrate W1. Therefore, almost contaminants can be removed from the substrate W1 by the first dry-cleaning device E10 and the first wet-cleaning device E20.

The second dry-cleaning device E30 is configured to clean a chip array 10, as shown in FIG. 2B, using gas or plasma. The chip array C10 includes a number of chips C1 arranged in an array. In some embodiments, the chips C1 are attached to a thin film.

In some embodiments, the second dry-cleaning device E30 may be a plasma device. The second dry-cleaning device E30 is configured to perform a plasma process on the chips C1 of the chip array 10. The second dry-cleaning device E30 generates plasma dispensing to the surfaces of the chips C1 for cleaning the contaminants on the surfaces of the chips C1.

After the chips C1 are cleaned by the second dry-cleaning device E30, the chips C1 are transported to the second wet-cleaning device E40. The second wet-cleaning device E40 is configured to clean the chips C1 using liquid. In some embodiments, the second wet-cleaning device E40 dispenses liquid to the chips C1 to clean the contaminants on the surface of the chips C1.

In some embodiments, the chips C1 are cleaned by the second wet-cleaning device E40 first, and then cleaned by the second dry-cleaning device E30. In some embodiments, the second dry-cleaning device E30 is configured to clean the contaminants adhered on the chips C1 or having a great size. The second wet-cleaning device E40 is configured to clean the contaminants, such as dust, falling on the chips C1. Therefore, almost contaminants can be removed from the substrate W1 by the second dry-cleaning device E30 and the second wet-cleaning device E40.

Figure 3:
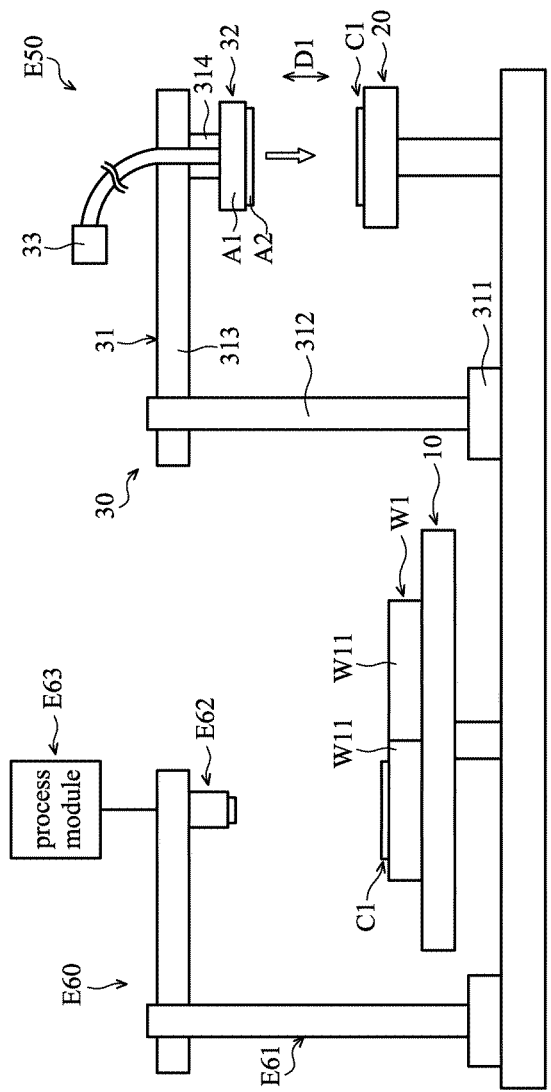
FIG. 3 is a schematic view of the chip-stacking device and the chip-stacking device in accordance with some embodiments of the disclosure.

FIG. 3 is a schematic view of the chip-stacking device E50 and the alignment device E60 in accordance with some embodiments of the disclosure. The chip-stacking device E50 is configured to stack the chip C1 to the substrate W1. In some embodiments, the bottom chip W11 is a central processing unit (CPU), and the chip C1 is a display unit. The chip C1 is electrically connected to the bottom chip W11 when the chip C1 is stacked on the bottom chip W11. In some embodiments, a number of chips C1 are stacked to one bottom chip W11.

The chip-stacking device E50 includes a substrate support 10, a chip support 20 and a transport device 30. The substrate support 10 is configured to support the substrate W1. In some embodiments, the substrate support 10 is a chuck, such as a wafer chuck. After the substrate W1 is cleaned by the first wet-cleaning device E20, the substrate W1 is transported onto the substrate support 10.

The chip support 20 is configured to support the chip C1. After the chips C1 are cleaned by the second wet-cleaning device E40, one of the chips C1 is transported onto the chip support 20. In some embodiments, the chip support 20 is a chip-transport device. The chip-transport device is configured to transfer the chip C1, and flip the chip C1. In some embodiments, the chip-transport device is configured to rotate the chip C1.

The transport device 30 is configured to dispose the chip C1 onto the substrate W1. The transport device 30 includes a transport mechanism 31, a bond head 32 and a vacuum pump 33. The transport mechanism 31 is configured to move the bond head 32. For example, the transport mechanism 31 is configured to move the bond head 32 toward the chip C1, or to move the bond head 32 with the chip C1 toward the substrate W1.

In some embodiments, the transport mechanism 31 includes a track 311, a stand 312, an arm 313, and a holding element 314. The stand 312 can be moved along the track 311. In some embodiments, the arm 313 extends from and substantially perpendicular to the stand 312. The arm 313 is movably and rotatably disposed on the stand 312. For example, the arm 313 can be moved along a direction D1. For example, the arm 313 itself can move along stand 312, and rotate about stand 312

The holding element 314 is disposed on the end of the arm 313 configured to hold the bond head 32. In some embodiments, the bond head 32 is detachably disposed on the holding element 314 of the transport mechanism 31. The bond head 32 is configured to hold the chip C1. The bond head 32 is replaceable to meet various sizes of the chips.

The vacuum pump 33 is coupled with the bond head 32, and drawing air via the bond head 32. Therefore, the bond head 32 can generate a suction force on the chip C1 by the vacuum pump 33 when the chip C1 is attached to the bond head 32.

Figure 4A:
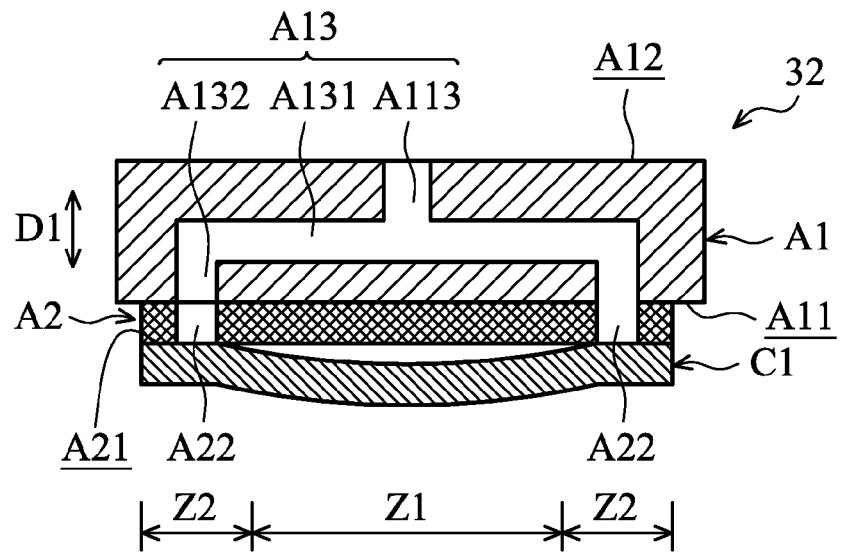
FIG. 4A is a cross-sectional view of the bond head in accordance with some embodiments of the disclosure.
Figure 4B:
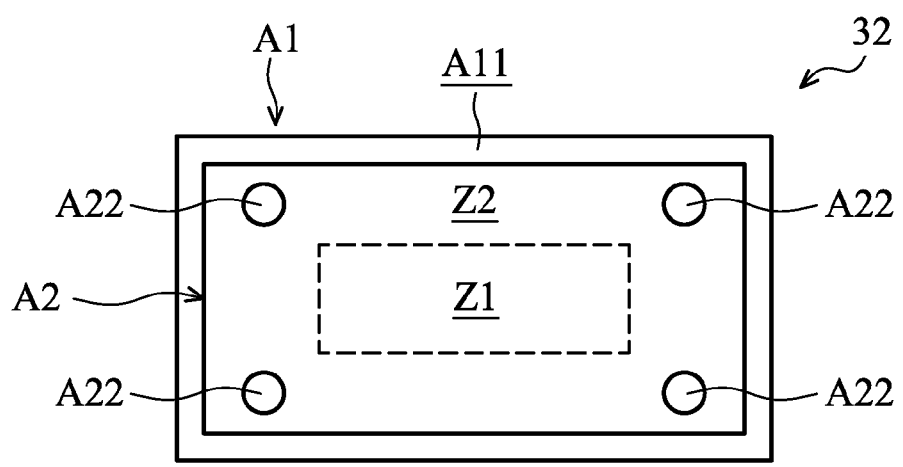
FIG. 4B is a bottom view of the bond head in accordance with some embodiments of the disclosure.

FIG. 4A is a cross-sectional view of the bond head 32 in accordance with some embodiments of the disclosure. FIG. 4B is a bottom view of the bond head 32 in accordance with some embodiments of the disclosure.

The bond head 32 includes a bond base A1 and an attaching element A2. The bond base A1 is disposed on the holding element 314 of the transport mechanism 31 as shown in FIG. 3. In some embodiments, the bond base A1 is a plate structure. The bond base A1 is made of metal, such as stainless steel. The bond base A1 extends in the horizontal plane substantially perpendicular to the direction D1.

The bond base A1 includes a bottom surface A11, a top surface A12, and a channel A13. The bottom surface A11 is opposite to the top surface A12. The channel A13 is formed in the bond base A1, and connected to the bottom surface A11 and the top surface A12. The channel A13 is coupled with the vacuum pump 33 via the top surface A12.

In some embodiments, the channel A13 includes a main channel A131, a number of bottom openings A132, and a top opening A133. The main channel A131 is embedded in the bond base A1. The bottom openings A132 are located at the edge area of the bottom surface A11, and connected to the main channel A131. In some embodiments, the bottom openings A132 are located at the corners of the bottom surface A11. The top opening A133 is located at the center area of the top surface A133, and connected to the main channel A131. The top opening A133 is coupled with the vacuum pump 33.

The attaching element A2 is disposed on the bottom surface A11 of the bond base A1. The attaching element A2 is configured to allow the chip C1 to be attached on the attaching element A2. In some embodiments, the attaching element A2 is a plate structure. The attaching element A2 is parallel to the bond base A1. In some embodiments, the attaching element A2 is fixed at the bottom surface A11 of the bond base A1. In some embodiments, the attaching element A2 is made of flexible material, such as plastic. In some embodiments, the flexible material is thermosetting plastic or thermoplastic.

The attaching element A2 includes a number of vacuum holes A22 passing through the attaching element A2 and connected to the bottom openings A132 of the channel A13. In other words, the vacuum pump 33 is coupled with the vacuum holes A22 via the channel A13. Therefore, the attaching element A2 can generate a suction force to attract the chip C1 by the vacuum pump 33 drawing air via the vacuum holes A22. The bond head 32 attracts the chip C1 using the suction force via the vacuum hole A22.

In some embodiments, the vacuum holes A22 extend along the direction D1. The vacuum holes A22 are located at the edge area Z2 of the attaching element A2. The edge area Z2 is around a center area Z1. For example, edge areas Z2 are located at two opposite sides of the center area Z1. In some embodiments, the vacuum holes A22 are located around the sidewalls of the attaching element A2. In some embodiments, the vacuum holes A22 are located at the corners of the attaching element A2 as shown in FIG. 4B.

In some embodiments, the attaching element A2 has an attaching surface A21, which is a flat surface, configured to attach the chip C1. When the vacuum pump 33 is enabled, the vacuum holes A22 are vacuumed by the vacuum pump 33. As shown in FIG. 4A, suction forces are generated via the vacuum holes A22 at the edge area Z2 of the attaching element A2 and attract the edges of chip C1. The bond head 32 has a suction force at the edge area Z2 stronger than that of the center area Z1.

In some embodiments, the chip C1 is a flexible film-shaped structure when it is attached on the bond head 32. In some embodiments, the chip C1 has a thickness in a range from about 10 um to 300 um, for example. Therefore, the center of the chip C1 is warped downwardly by gravity as shown in FIG. 4A when the edge of the chip C1 is attached to the edge area Z2 of the attaching surface A21. In other words, the center of the chip C1 is separated from the center area Z1 of the attaching surface A21.

As shown in FIG. 3, the alignment device E60 is configured to check the offset between the chip C1 and the substrate W1. The alignment device E60 includes a transport device E61, an image sensor E62, and a process module E63. The transport device E61 is configured to move the image sensor E62. The image sensor E62 is disposed on the transport device E61. The image sensor E62 is configured to capture an image of the chip C1 and the substrate W1 when the chip C1 is stacked on the substrate W1. The image sensor E62 also generates an image signal according to the image.

The process module E63 is coupled with the image sensor E62. The process module E63 is configured to receive the image signal, and analyze the image signal. The process module E63 is also configured to generate a correction signal in response to the image signal and the offset between the chip C1 and the substrate W1. Afterward, the transport device 30 transports the subsequent chip to the substrate W1 according to the correction signal.

Figure 5A:
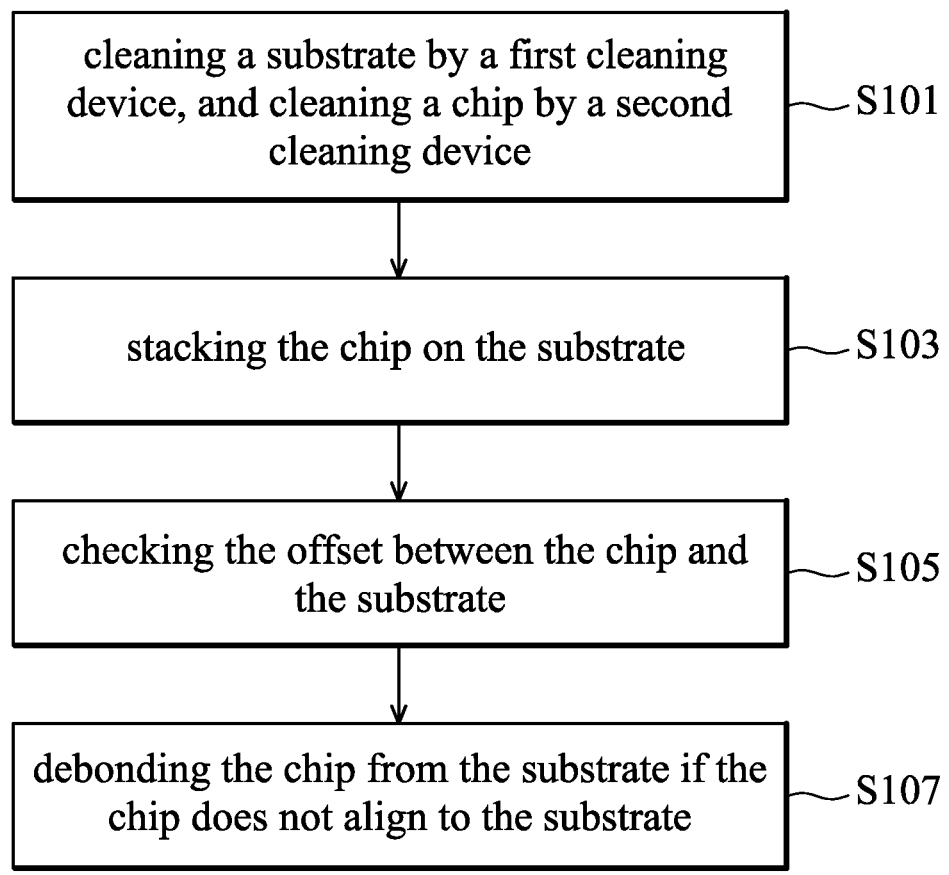
FIG. 5A is a flow chart of a stacking method in accordance with some embodiments of the disclosure.
Figure 5B:
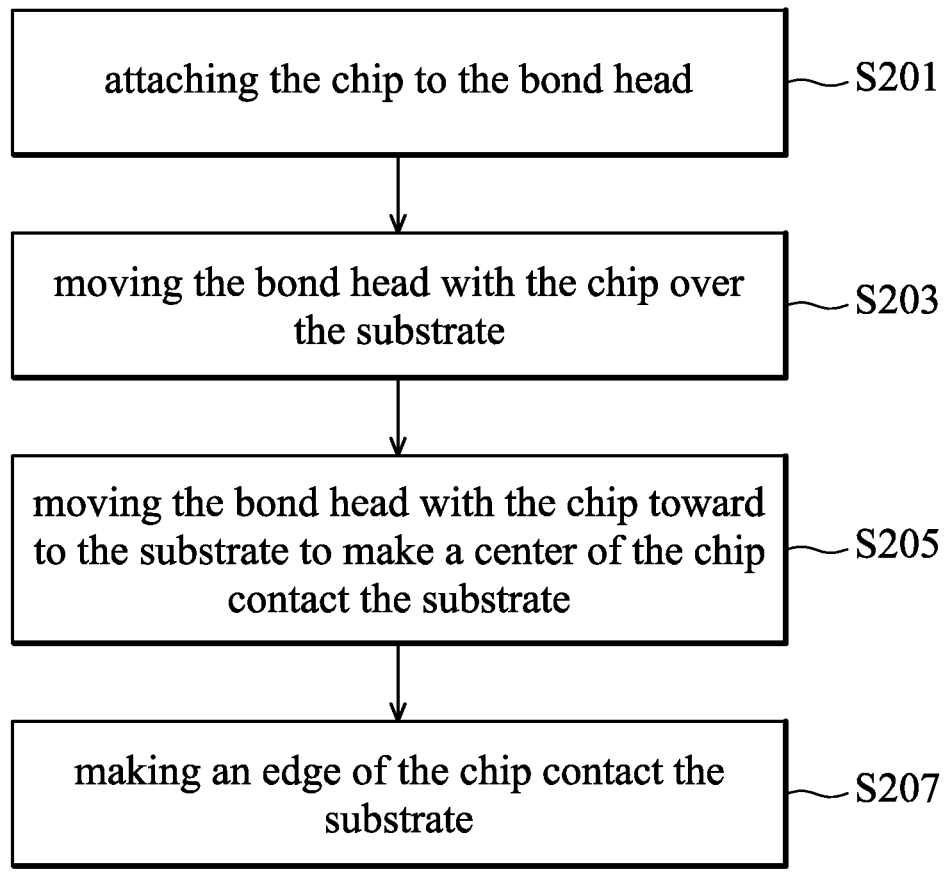
FIG. 5B is a flow chart of step S103 of FIG. 5A in accordance with some embodiments of the disclosure.

FIG. 5A is a flow chart of a stacking method in accordance with some embodiments of the disclosure. FIG. 5B is a flow chart of step S103 of FIG. 5A in accordance with some embodiments of the disclosure. FIGS. 6A to 6G are schematic views of the stacking method during intermediate stages.

In step S101, the substrate W1 is cleaned by a first cleaning device. In some embodiments, the first cleaning device includes the first dry-cleaning device E10 and the first wet-cleaning device E20. The substrate W1 is cleaned by the first dry-cleaning device E10. Afterward, the substrate W1 is cleaned by the first wet-cleaning device E20.

Furthermore, the chips C1 are cleaned by a second cleaning device. In some embodiments, the second cleaning device includes the second dry-cleaning device E30 and the second wet-cleaning device E40. The chips C1 are cleaned by the second dry-cleaning device E30. Afterward, the chips C1 are cleaned by the second wet-cleaning device E40.

By the cleaning devices E10~E40, the chip C1 is further cleaned before the chip C1 is attached to the substrate W1. The chip C1 and the substrate W1 are cleaned before the chip C1 is stacked on the substrate W1. Therefore, the contaminants between the chip C1 and the substrate W1 are decreased. The yield rate of the product of the chip C1 with the substrate W1 is increased.

In step S103, one of the chips C1 is stacked on the substrate W1. In some embodiments, the chips C1 are stacked on the substrate W1 according to the steps in FIG. 5B.

As shown in FIG. 5B, in step S201, the chip C1 is disposed on the chip support 20. The transport mechanism 31 moves the bond head 32 downward to contact the chip C1, as shown in FIG. 3. When the vacuum pump 33 is enabled, the attaching element A2 generates the suction force on the chip C1. Therefore, the chip C1 is attracted to the attaching surface A21 of the bond head 32.

Figure 6A:
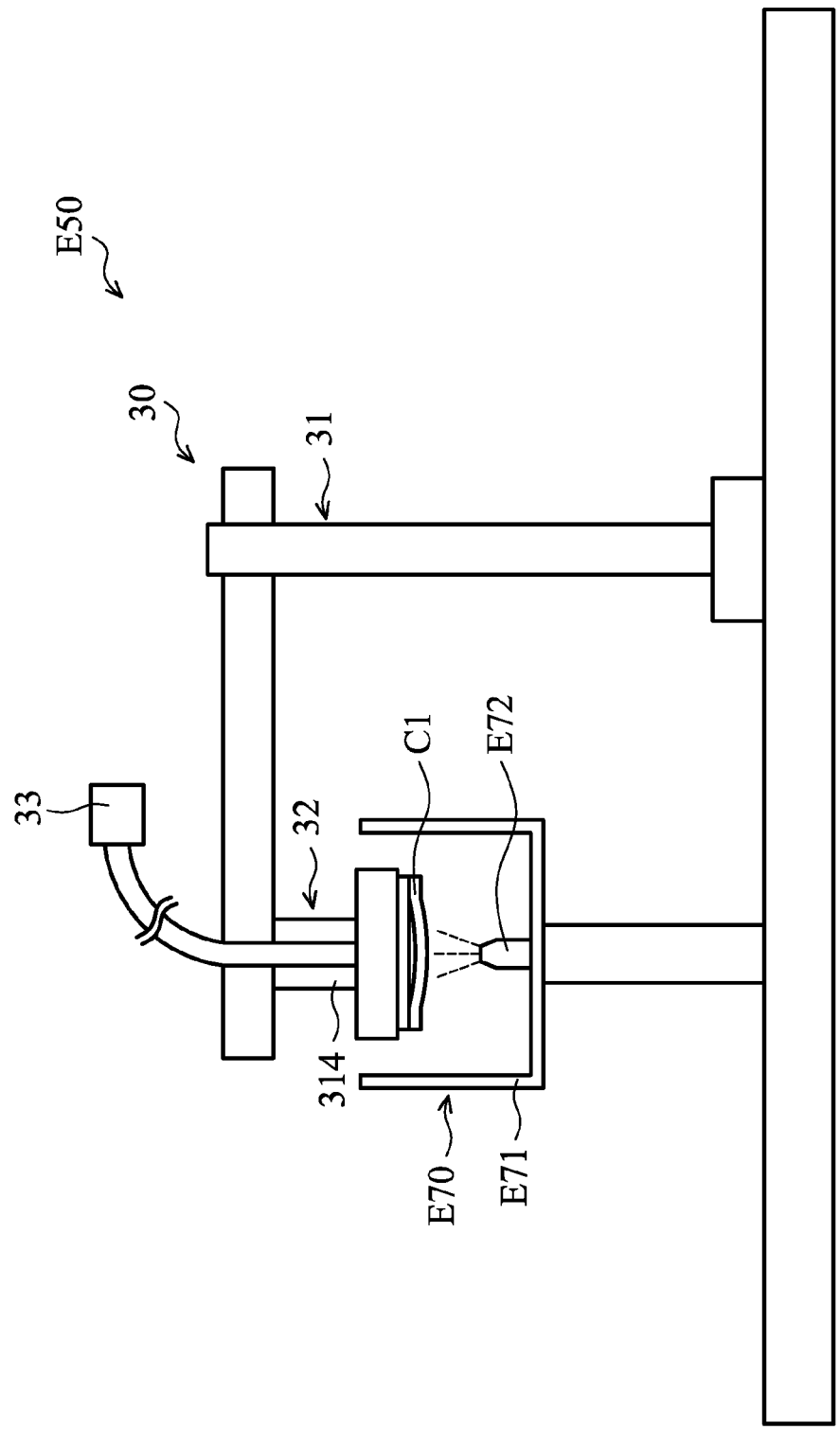

In some embodiments, the chip-stacking device E50 further includes a chip-cleaning device E70, as shown in FIG. 6A. The chip-cleaning device E70 is configured to clean the chip C1 when the chip C1 is attached to the bond head 32. The chip-cleaning device E70 includes a cover E71 and a nozzle E72. The nozzle E72 is disposed in the cover E71. The nozzle E72 is configured to spray liquid or gas onto the chip C1. In some embodiments, the liquid is water or Deionized water. In some embodiments, the liquid is acid liquid, or alkaline liquid. In some embodiments, the gas is inert gas, such as $N_2$. The cover E71 is configured to prevent the liquid from spraying on other devices.

The transport mechanism 31 moves the bond head 32 with the chip C1 over the nozzle E72. Afterward, the nozzle E72 sprays liquid or gas onto the bottom surface of the chip C1. By the chip-cleaning device E70, the chip C1 is further cleaned before the chip C1 is attached to the substrate W1.

Figure 6B:
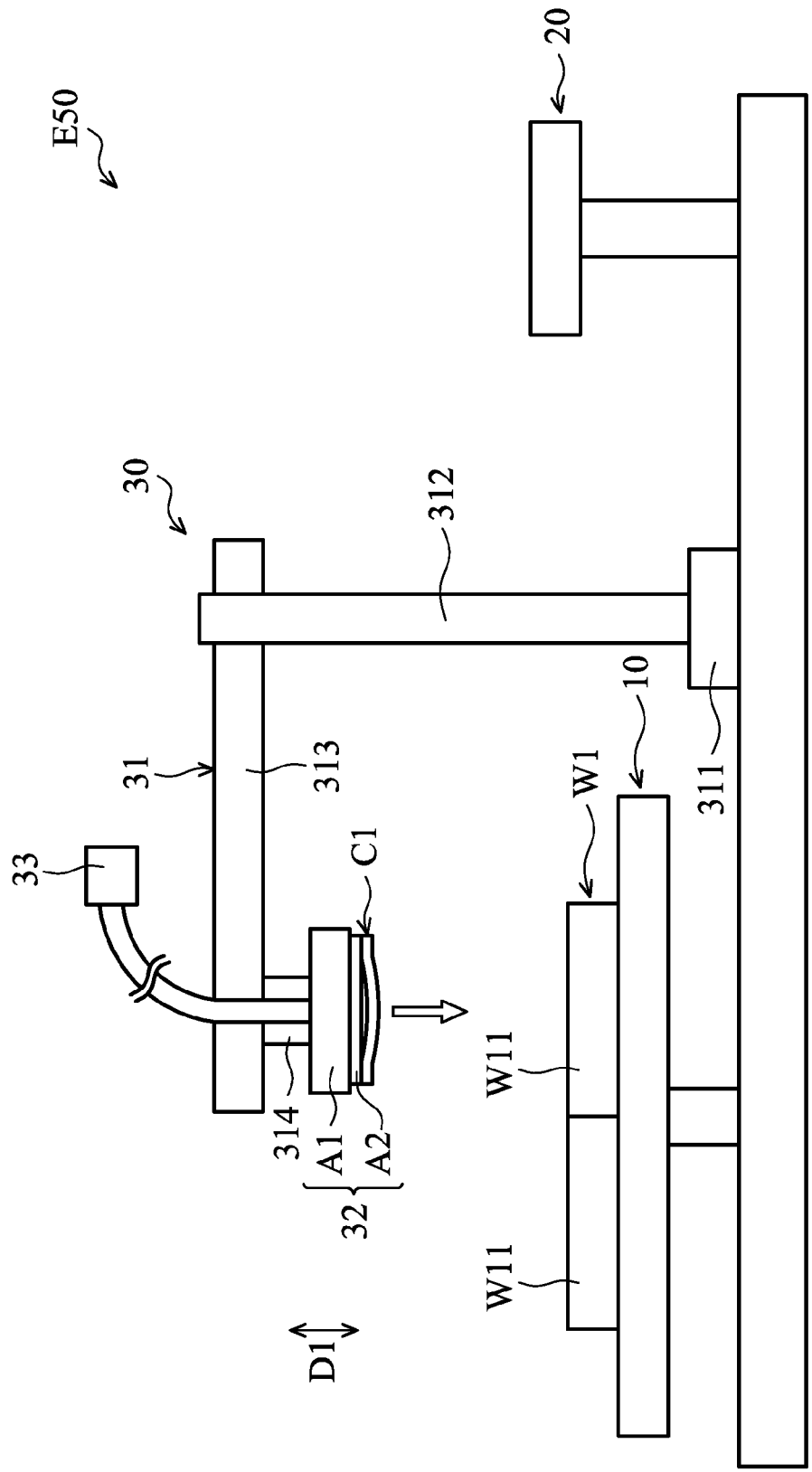

In step S203, the transport mechanism 31 moves the bond head 32 with the chip C1 over the substrate W1, as shown in FIG. 6B.

In step S205, an attaching process is initiated on the substrate W1. The transport mechanism 31 moves the bond head 32 with the chip C1 toward the substrate W1 along the direction D1 to make the center of the chip C1 contact the substrate W1. As shown in FIG. 6C. In some embodiments, the edges of the chip C1 is separated from the bottom chips W11 of the substrate when the center of the chip C1 begins to contact one of the bottom chips W11 of the substrate W1.

Figure 6D:
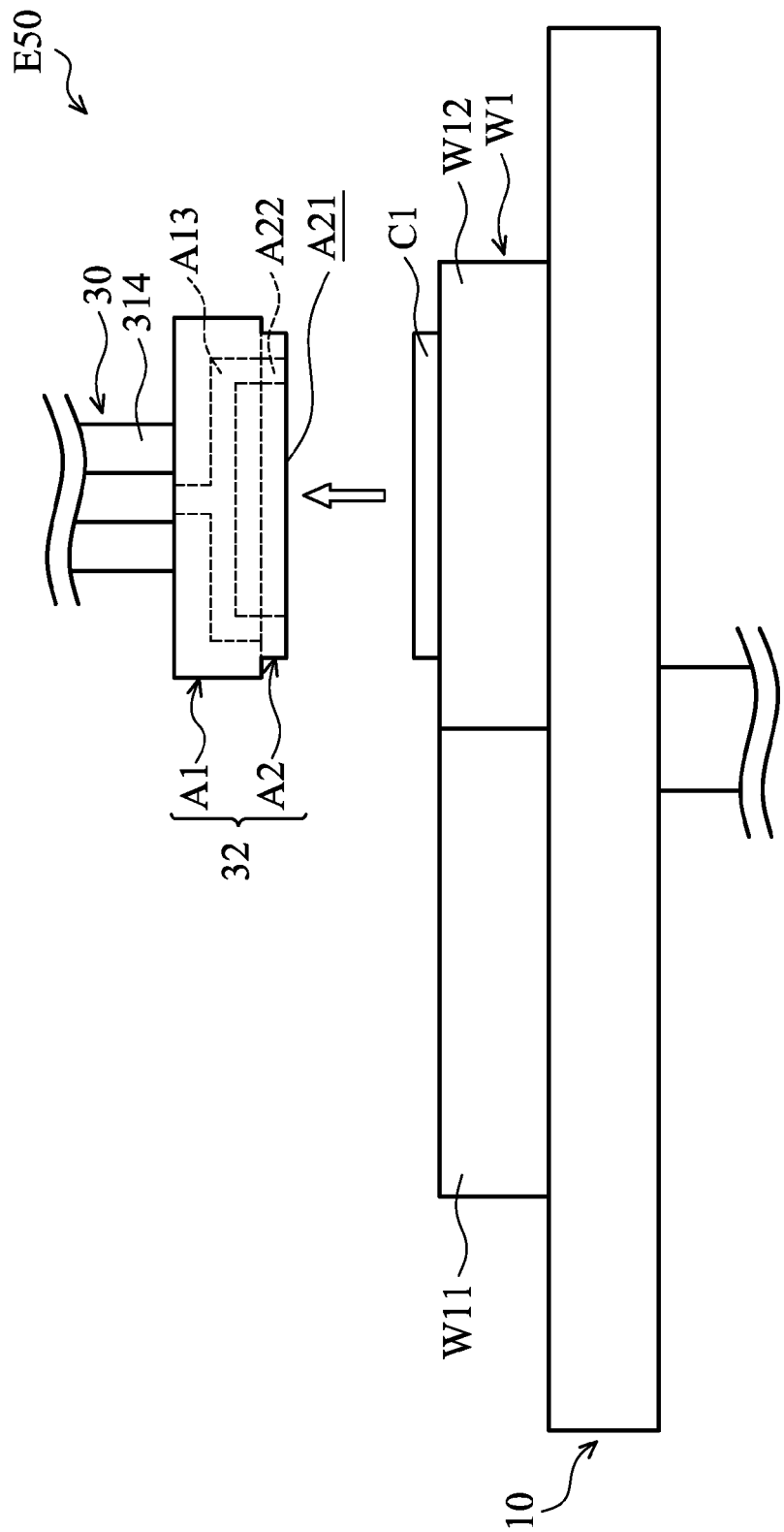

In step S207, the suction force is gradually decreased via the control of the vacuum pump 33. In some embodiments, the vacuum pump 33 is disabled when the center of the chip C1 contacts the substrate W1. Afterward, the edge of the chip C1 is separated from the attaching element A2 since the suction force is decreased or disappeared. The chip C1 gradually contacts the substrate W1 from the center to the edge of the chip C1 as shown in FIG. 6D. In other words, the center of the chip C1 contacts the substrate W1 earlier than the edge of the chip C1 when the chip C1 is attached to the attaching surface A21 during the attaching process.

Since the chip C1 gradually contacts the substrate W1 from the center to the edge of the chip C1, gas bubbles are not formed between the chip C1 and the substrate W1 after the chip C1 attaches to the substrate W1. Therefore, electrical connections between the chip C1 and the substrate W1 are not impeded by gas bubbles. The yield rate of the product of the chip C1 with the substrate W1 is increased.

Figure 6E:
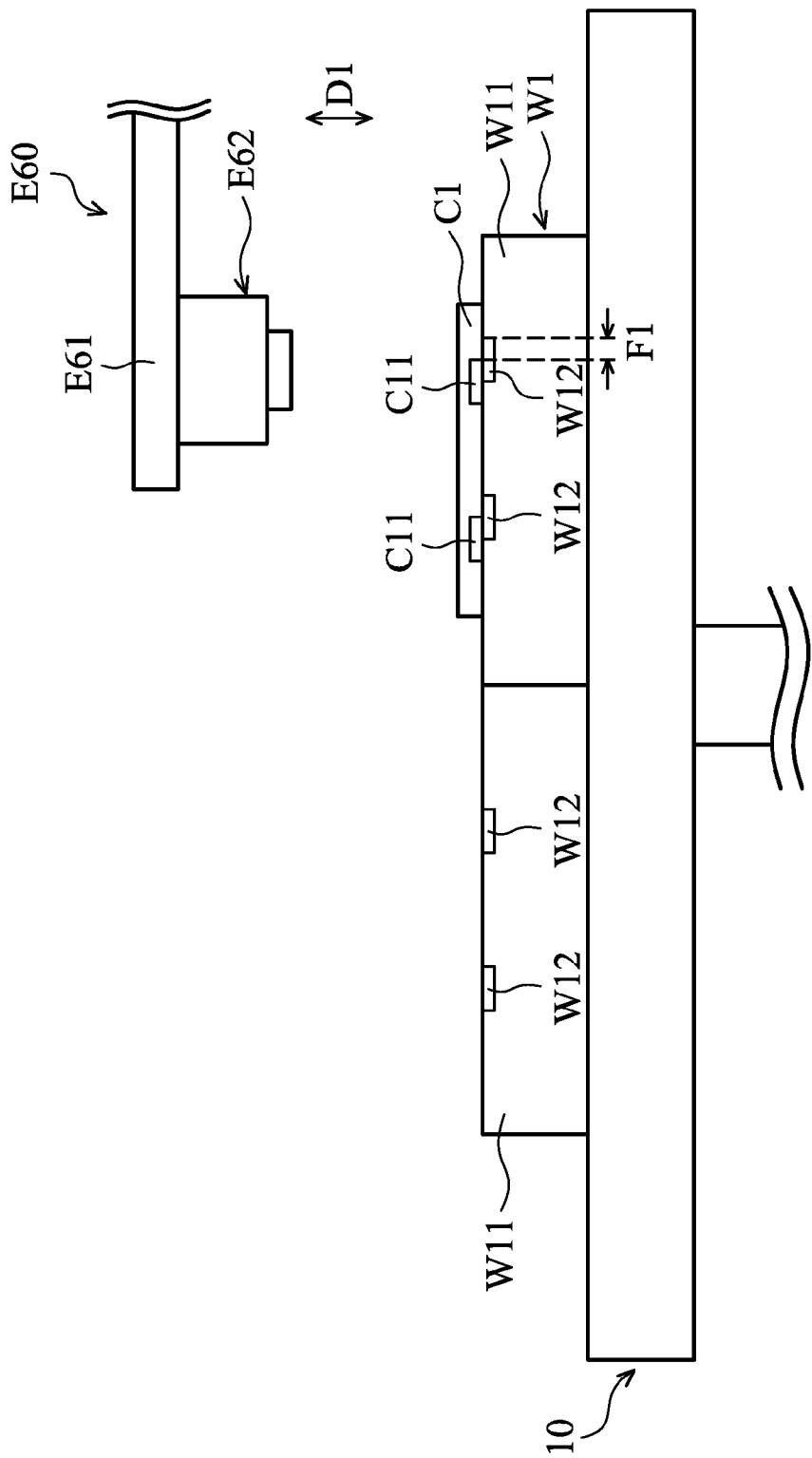

In step S105, the alignment device E60 checks the offset between the chip C1 and the substrate W1. In some embodiments, the chip C1 further includes marks C11, and the substrate W1 further includes marks W12, as shown in FIG. 6E. The image sensor E62 captures an image of the mark W12 and the mark C11 stacked on the substrate W1. Afterward, the image sensor E62 transmits an image signal to the process module E63 (as shown in FIG. 3).

The process module E63 analyzes the image signal and generates a correction signal according to the offset F1 between the mark C11 and the mark W12. When the subsequent chip is stacked on the substrate W1, the position of the subsequent chip relative to the substrate W1 is modified according to the correction signal and the offset F1. Therefore, the mark of the subsequent chip is aligned with the mark W12 of the substrate W1. The subsequent chip can be accurately stacked onto the substrate W1.

Figure 6F:
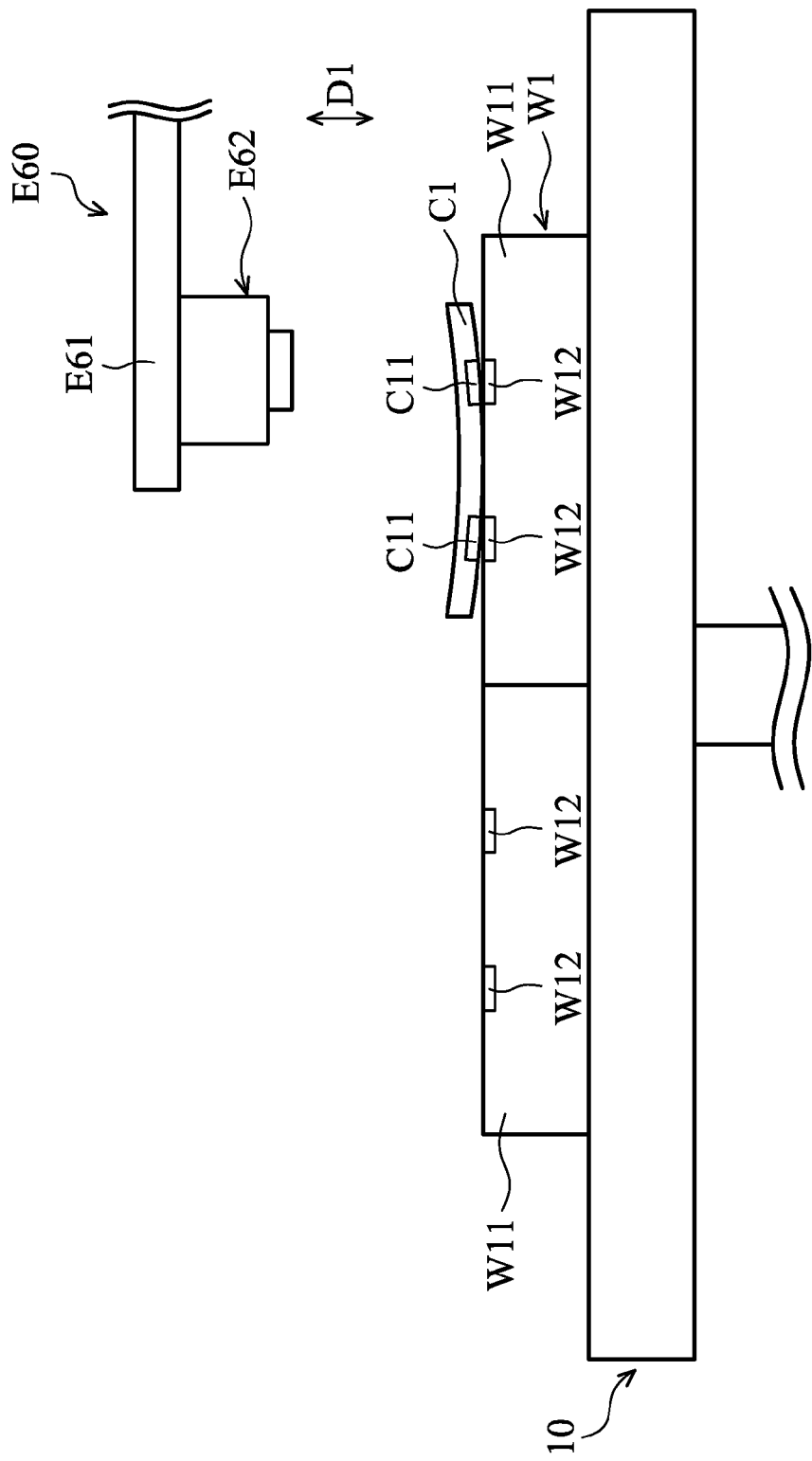

As shown in FIG. 6F, the chip C1 may be deformed when the chip C1 is stacked on the substrate W1. In some embodiments, the shape of the mark C11 is deformed since the edge of the chip C1 is deformed. The process module E63 further analyzes the image signal and generates a correction signal in response to the deformation of the shape of the mark C11. If the shape of the mark C11 is deformed, the process module E63 increases the pressure on the edge of the subsequent chip. Therefore, the edge of the subsequent chip can completely contact the substrate W1.

Figure 6G:
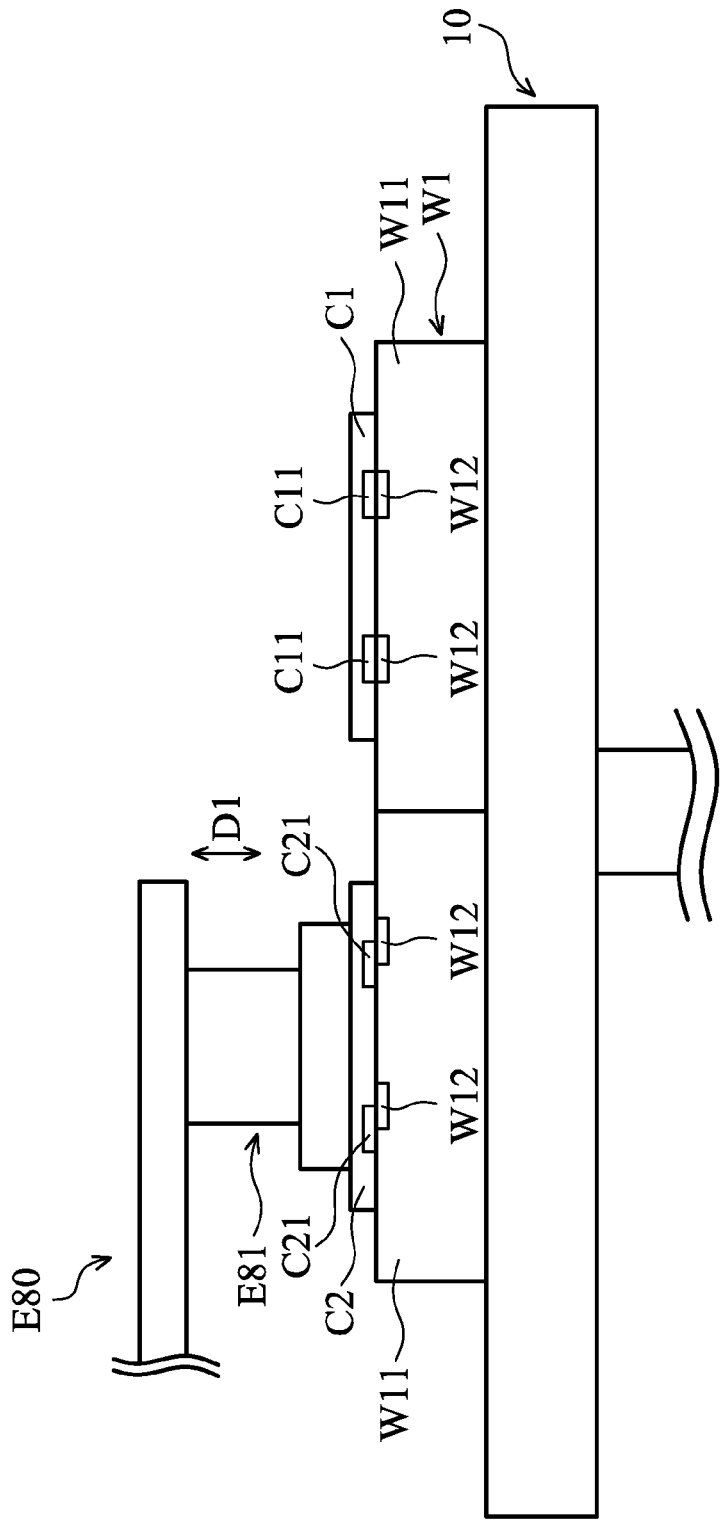

In step S107, the debonding device E80 separates the chip C1 from the substrate W1 when the chip C1 does not correctly align or completely contact the substrate W1. As shown in FIG. 6G, the marks C21 of the chip C2 are not correctly aligned with the marks W12 of the substrate W1. The debonding device E80 includes a debonding head E81. The debonding head E81 generates a suction force on the chip C2, and separates the chip C2 from the substrate W1 to allow another chip stacks on the position that the chip C2 has been disposed.

Figure 7A:
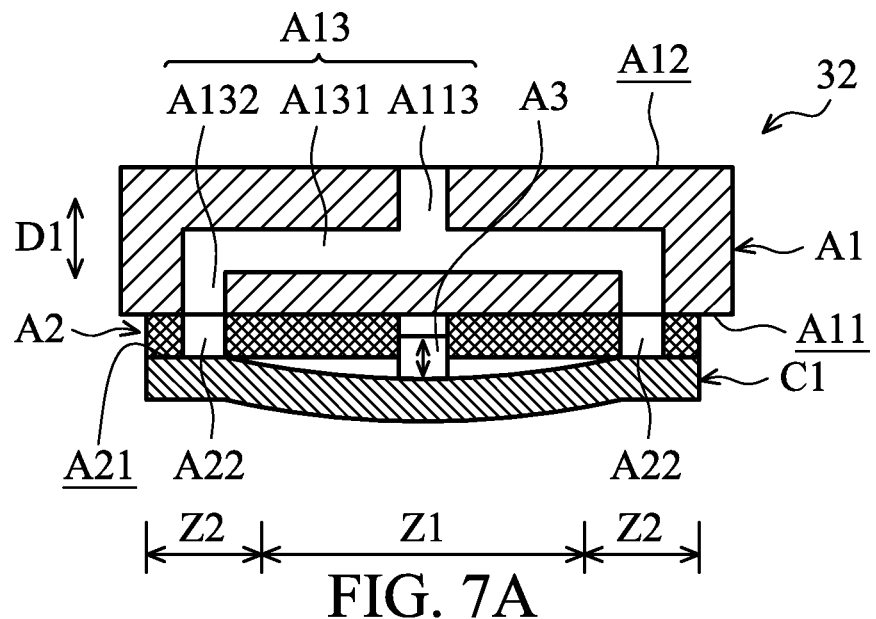
FIG. 7A is a cross-sectional view of the bond head in accordance with some embodiments of the disclosure.
Figure 7B:
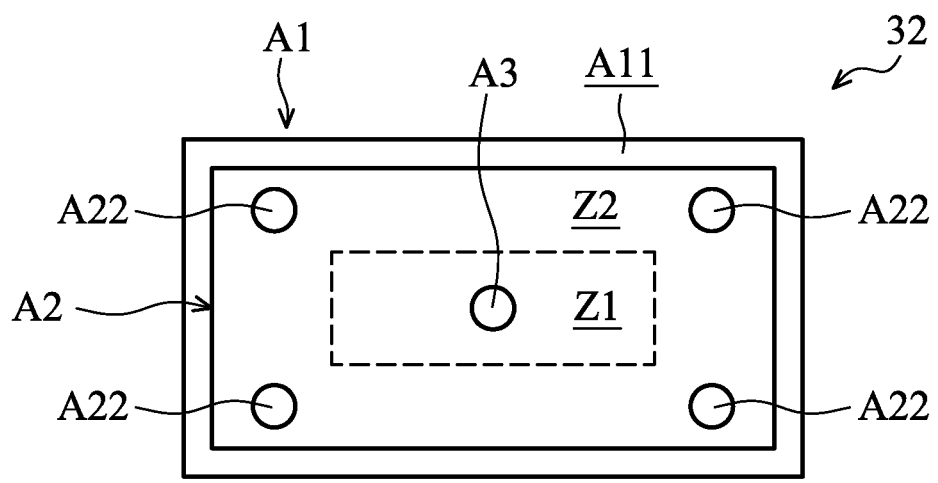
FIG. 7B is a bottom view of the bond head in accordance with some embodiments of the disclosure.

FIG. 7A is a cross-sectional view of the bond head 32 in accordance with some embodiments of the disclosure. FIG. 7B is a bottom view of the bond head 32 in accordance with some embodiments of the disclosure.

The bond head 32 further includes a pushing element A3 disposed on the attaching element A2 and located at the center area Z1. The pushing element A3 protrudes over the attaching surface A21. The chip C1 is warped by the pushing element A3 when the chip C1 is attached to the attaching surface A21. In some embodiments, the pushing element A3 is a rod structure. The pushing element A3 has a width in a range from about 0.05 mm to about 5 mm.

In some embodiments, the pushing element A3 is movably disposed in the attaching element A2. In steps S201 and S203 of the stacking method, the pushing element A3 is embedded in the attaching element A2 and does not protrude over the attaching surface A21. The suction force on the chip A1 may be greater than the embodiment in FIGS. 4A and 4B. Therefore, the chip C1 is stably attached to the attaching surface A21 while transferring the chip C1 using the transport mechanism 31.

In steps S205 and S207 of the stacking method, the pushing element A3 protrudes over the attaching surface A21 and pushes the center portion of the chip C1, and the chip C1 is warped by the pushing element A3 as shown in FIG. 7A. In some embodiments, the pushing element A3 pushes the chip C1 by a push force in a range from about 0.5N to 200N.

Figure 8A:
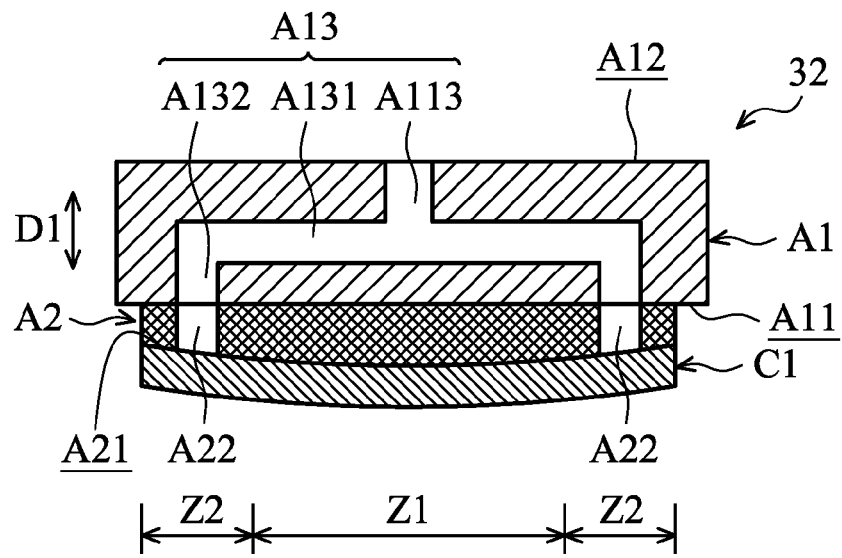
FIG. 8A is a cross-sectional view of the bond head in accordance with some embodiments of the disclosure.
Figure 8B:
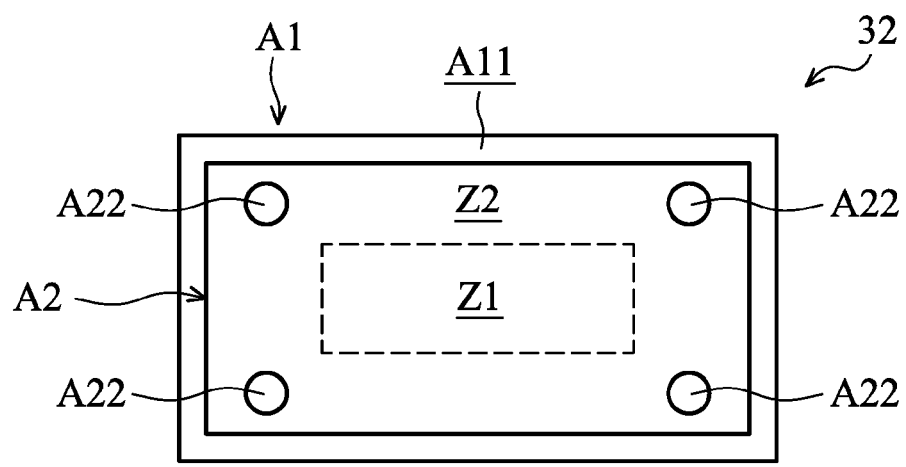
FIG. 8B is a bottom view of the bond head in accordance with some embodiments of the disclosure.

FIG. 8A is a cross-sectional view of the bond head 32 in accordance with some embodiments of the disclosure. FIG. 8B is a bottom view of the bond head 32 in accordance with some embodiments of the disclosure.

The bottom surface A11 is opposite to the top surface A12. The channel A13 is formed in the bond base A1, and connected to the bottom surface A11 and the top surface A12. The channel A13 is coupled with the vacuum pump 33 via the top surface A12.

The attaching element A2 is disposed on the bottom surface A11 of the bond base A1. The vacuum holes A22 passes through the attaching element A2, and are connected to the channel A13. The vacuum holes A22 is located at the edge area Z2 of the attaching surface A21.

In some embodiments, the attaching surface A21 is a warped surface. For example, the center area Z1 of the attaching element A2 is higher than the edge area Z2 of the attaching element A2 relative to the bond base A1. The chip C1 is configured to attach on the center area Z1 and the edge area Z2.

When the vacuum pump 33 is enabled, the vacuum holes A22 are vacuumed by the vacuum pump 33. As shown in FIG. 8A, suction forces are generated via the vacuum holes A22 at the edge area Z2 of the attaching surface A21. Since the vacuum holes A22 are located at the edge area Z2 of the attaching surface A21, the edges of the chip C1 is attached to the edge area Z2 of the attaching element A2 by the vacuum holes A22. Moreover, since the attaching surface A21 is a warped surface. In some embodiments, a surface of the chip C1 may be warped along the attaching surface A21 when the chip C1 is attached to the bond head 32. For example, the center of chip C1 is also attached to the attaching surface A21.

In step S207 of the stacking method, the center of the chip C1 contacts the substrate W1 earlier than the edge of the chip C1 during the attaching process.

Figure 9A:
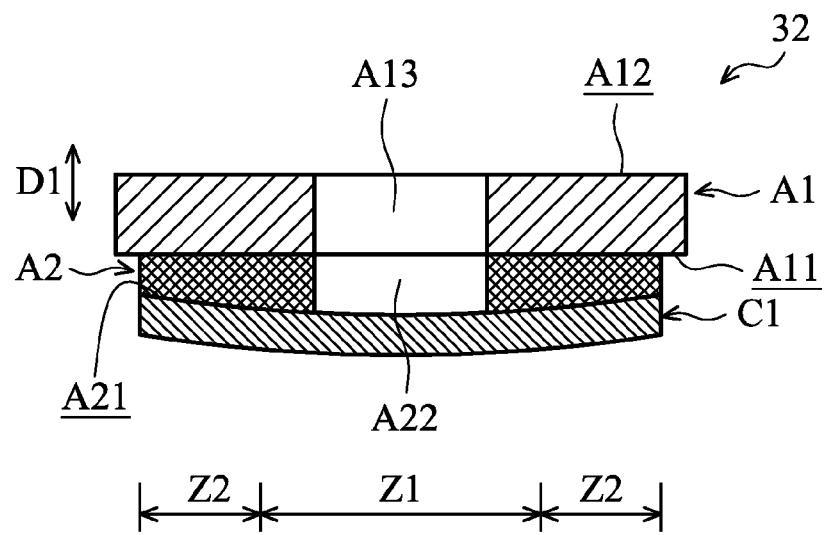
FIG. 9A is a cross-sectional view of the bond head in accordance with some embodiments of the disclosure.
Figure 9B:
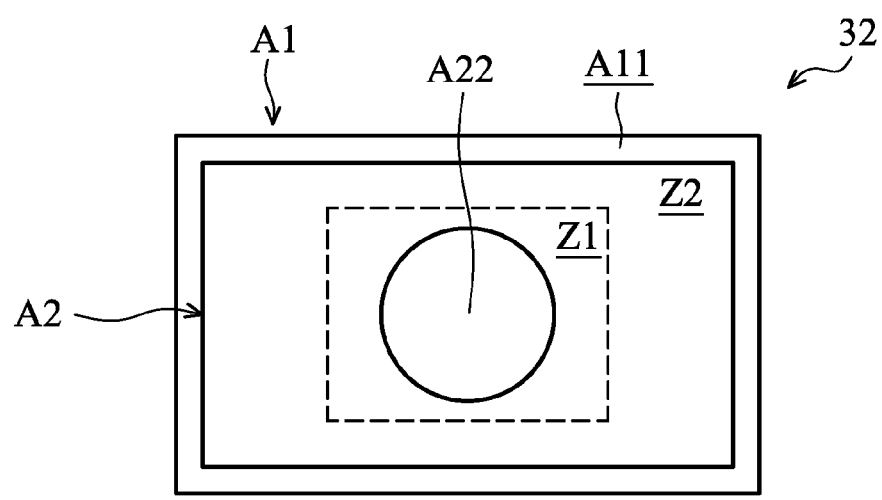
FIG. 9B is a bottom view of the bond head in accordance with some embodiments of the disclosure.

FIG. 9A is a cross-sectional view of the bond head 32 in accordance with some embodiments of the disclosure. FIG. 9B is a bottom view of the bond head 32 in accordance with some embodiments of the disclosure. In some embodiments, the channel A13 extends along the direction D1. The attaching element A2 includes one vacuum hole A22 connected to the channel A13. The vacuum hole A22 is located at the center area Z1 of the attaching surface A21.

In some embodiments, the attaching surface A21 is a warped surface. The chip C1 is configured to attach on the warped surface. Since the vacuum hole A22 is located at the center area Z1 of the attaching surface A21, the center of the chip C1 is attached to the center area Z1 of the attaching element A2 by the vacuum hole A22. Moreover, since the attaching surface A21 is a warped surface, the edge of chip C1 is also attached to the attaching surface A21. In other words, the chip C1 is warped along the attaching surface A21 when the chip C1 is attached to the attaching element A2.

Figure 10A:
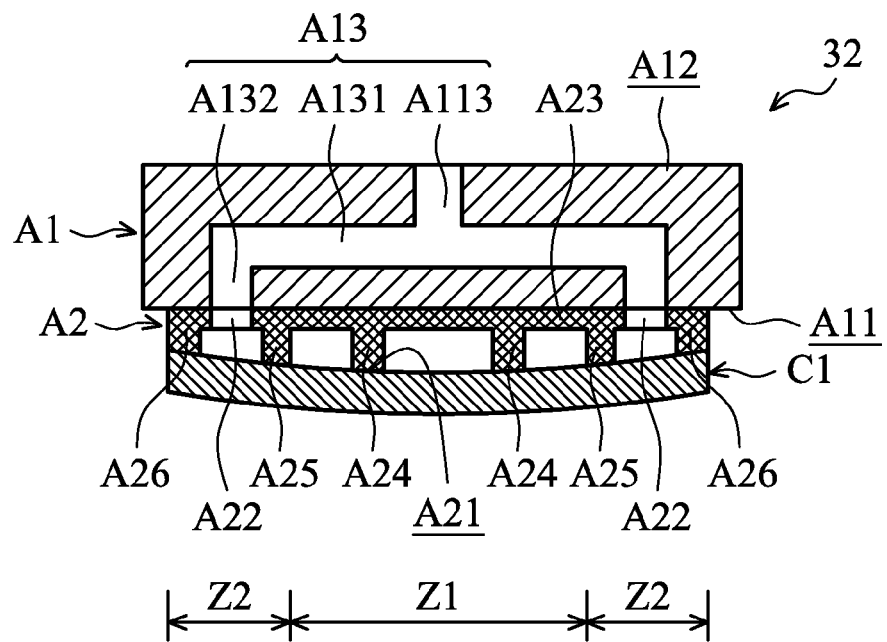
FIG. 10A is a cross-sectional view of the bond head in accordance with some embodiments of the disclosure.
Figure 10B:
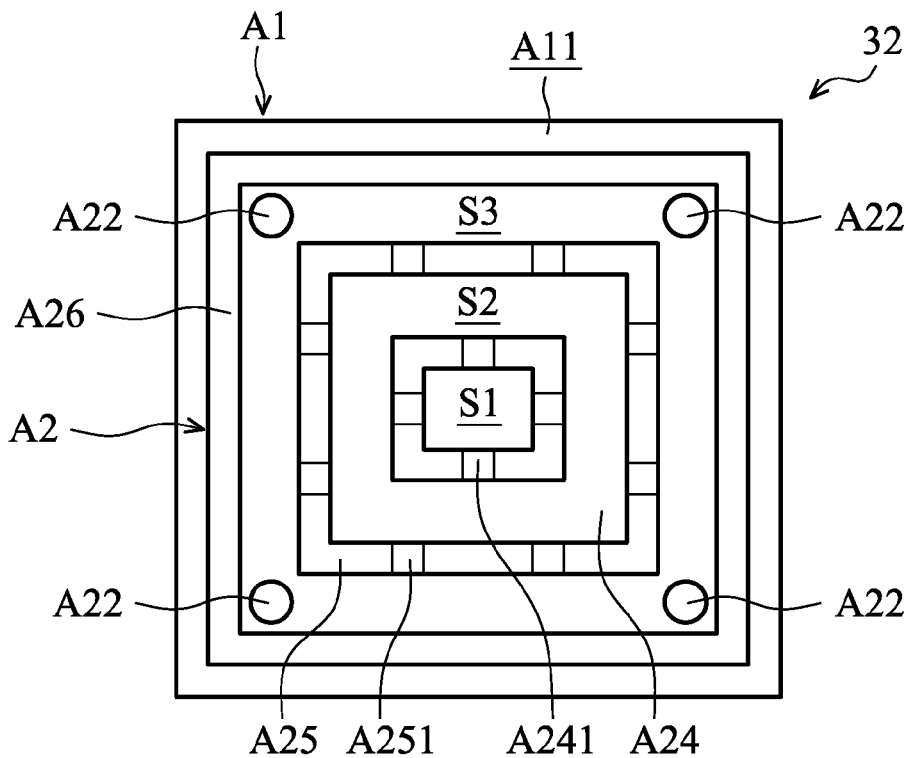
FIG. 10B is a bottom view of the bond head in accordance with some embodiments of the disclosure.

FIG. 10A is a cross-sectional view of the bond head 32 in accordance with some embodiments of the disclosure. FIG. 10B is a bottom view of the bond head 32 in accordance with some embodiments of the disclosure.

The main channel A131 is embedded in the bond base A1. The bottom openings A132 are located at the edge area of the bottom surface A11, and connected to the main channel A131. The top opening A133 is located at the center area of the top surface A133, and connected to the main channel A131. The top opening A133 is coupled with the vacuum pump 33.

The attaching element A2 is disposed on the bottom surface A11 of the bond base A1. The attaching element A2 includes a bottom portion A23, a center wall A24, a middle wall A25, and an edge wall A26. The bottom portion A23 is disposed on the attaching surface A21. The bottom portion A23 includes a number of vacuum holes A22. The vacuum holes A22 pass through the bottom portion A23, and are connected to the bottom openings A132 of the channel A13. The vacuum holes A22 are located at the edge area Z2 of the attaching surface A21.

In some embodiments, the bottom portion A23 is a plate structure. The center wall A24, the middle wall A25 and the edge wall A26 is disposed on the bottom portion A23. In some embodiments, the center wall A24, the middle wall A25 and the edge wall A26 are perpendicular to the bottom portion A23. The center wall A24, the middle wall A25, the edge wall A26 and the bottom portion A23 are formed as a single piece.

In some embodiments, the center wall A24, the middle wall A25 and the edge wall A26 and are ring-shaped structures. The center wall A24 is located in the center area Z1 of the attaching element A2. The middle wall A25 and the edge wall A26 are located in the edge area Z2 of the attaching element A2. The middle wall A25 is located between the center wall A24 and the edge wall A26. In other words, the middle wall A25 is around the center wall A24. The edge wall A26 is around the center wall A24.

In some embodiments, the middle wall A25 can be omitted. In some embodiments, the attaching element A2 includes a number of middle walls A25.

In some embodiments, the center wall A24 includes a number of through holes A241. The middle wall A25 includes a number of through holes A251. The space S1 in the center wall A24 communicates with the space S2, which is between the center wall A24 and the middle wall A25, via the through holes A241 (as shown in FIG. 10B). The space S3 between the middle wall A25 and the edge wall A26 communicates with the space S2 via the through holes A251.

The vacuum holes A22 are located at the edge area Z2 of the bottom portion A23. Therefore, when the vacuum pump 33 is enabled, the air in the space S3 is drawn via the vacuum holes A22, and a suction force on the chip C1 is generated via the space S3. Moreover, the air in the space S2 is also drawn by the vacuum pump 33 via the through holes A251 and space S3. The air in the space S1 is further drawn by the vacuum pump 33 via the through holes A241 and space S2. Therefore, the chip C1 is drawn by suction forces via the spaces S1 and S2. The chip C1 is attached to ends of the center wall A24, the middle wall A25 and the edge wall A26 when the vacuum pump 33 is enabled.

In some embodiments, the height of the center wall A24 relative to the bottom portion A23 is higher than the height of the middle wall A25 relative to the bottom portion A23. The height of the middle wall A25 relative to the bottom portion A23 is higher than the height of the edge wall A26 relative to the bottom portion A23. The ends of the center wall A2, the middle wall A25 and the edge wall forms the attaching surface A21. Each top surface of the walls A24-A26 forms a warped surface. Therefore, the chip C1 is warped when the chip C1 is attached to ends of the center wall A24, the middle wall A25 and the edge wall A26.

Figure 11A:
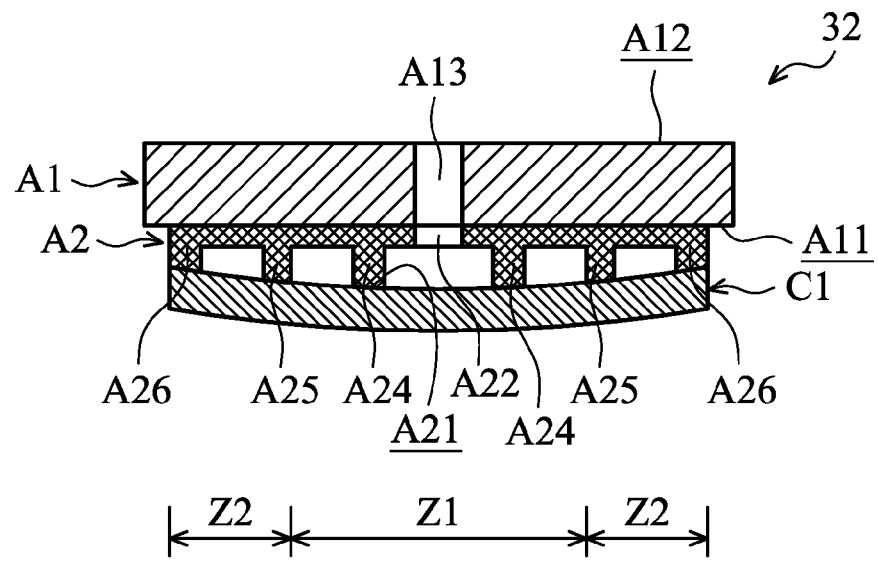
FIG. 11A is a cross-sectional view of the bond head in accordance with some embodiments of the disclosure.
Figure 11B:
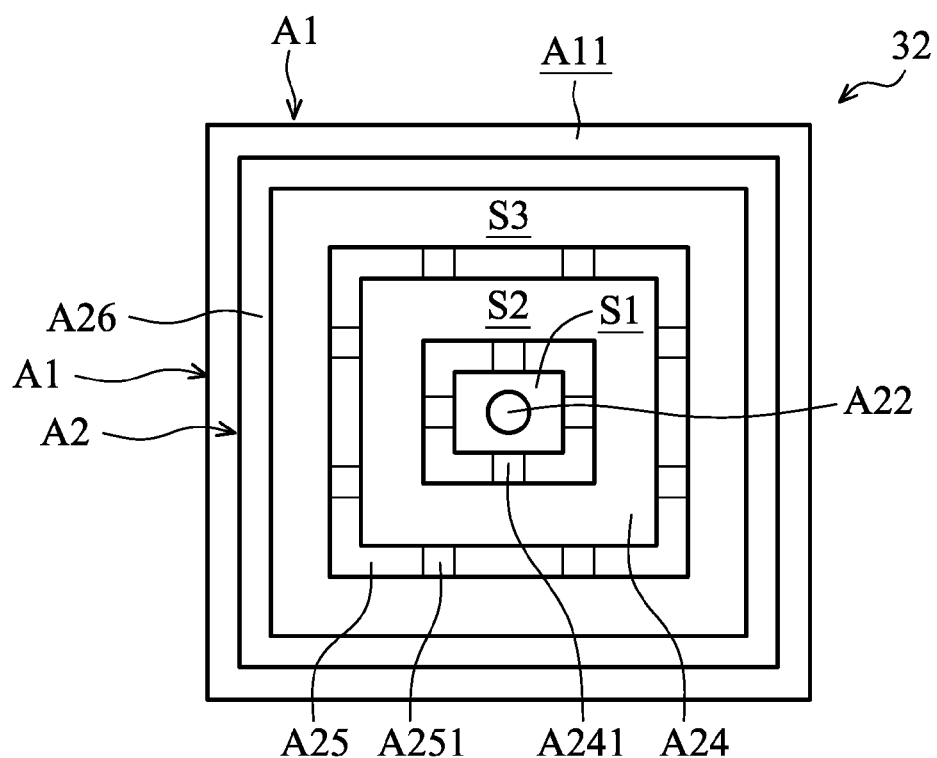
FIG. 11B is a bottom view of the bond head in accordance with some embodiments of the disclosure.

FIG. 11A is a cross-sectional view of the bond head 32 in accordance with some embodiments of the disclosure. FIG. 11B is a bottom view of the bond head 32 in accordance with some embodiments of the disclosure. In some embodiments, the channel A13 extends along the direction D1. The bottom portion A23 includes one vacuum hole A22 connected to the channel A13. The vacuum hole A22 is located at the center area Z1 of the bottom portion A23.

The vacuum hole A22 is located at the center area Z1 of the attaching surface A21. When the vacuum pump 33 is enabled, the air in the space S1 is drawn via the vacuum hole A22, and a suction force on the chip C1 is generated via the space S1. Moreover, the air in the space S2 is also drawn by the vacuum pump 33 via the through holes A241 and space S1. The air in the space S3 is further drawn by the vacuum pump 33 via the through holes A251 and space S2. Therefore, suction forces to the chip C1 are generated via the spaces S2 and S3. The chip C1 is attached to the ends of the center wall A24, the middle wall A25 and the edge wall A26 when the vacuum pump 33 is enabled.

In some embodiments, the height of the center wall A24 relative to the bottom portion A23 is higher than the height of the middle wall A25 relative to the bottom portion A23. The height of the middle wall A25 relative to the bottom portion A23 is higher than the height of the edge wall A26 relative to the bottom portion A23. Therefore, the chip C1 is warped when the chip C1 is attached to ends of the center wall A24, the middle wall A25 and the edge wall A26.

Embodiments of chip-stacking apparatus E1 and stacking methods are provided. The chip C1 and the substrate W1 are cleaned before the chip C1 is stacked on the substrate W1. Therefore, the contaminants between the chip C1 and the substrate W1 are decreased. Moreover, the subsequent chip is stacked on the substrate W1 according to the position of the previous chip stacked on the substrate. Therefore, the subsequent chip can be accurately stacked on the substrate W1. The yield rate of the product of the chip C1 with the substrate W1 is increased.

In addition, the center of the chip C1 contacts the substrate W1 earlier than the edge of the chip C1 when the chip C1 is attached to the attaching surface A21 during the attaching process. Since the chip C1 gradually contacts the substrate W1 from the center to the edge of the chip C1, gas bubbles between the chip C1 and the substrate W1 are decreased when the chip C1 stacks on the substrate W1 by the chip-stacking device E50 and stacking methods. Therefore, the yield rate of the product of the chip C1 with the substrate W1 is also increased.

In some embodiments, a chip-stacking apparatus for stacking a chip on a substrate is provided. The chip-stacking apparatus includes a substrate support configured to carry the substrate and a transport device configured to dispose a chip to the substrate. The transport device includes a bond head including a bond base and an attaching element disposed on the bond base and configured to allow the chip to be attached thereon. The center area of the attaching element is higher than an edge area of the attaching element relative to the bond base.

In some embodiments, a chip-stacking apparatus for stacking a chip on a substrate is provided. The chip-stacking apparatus includes a substrate support configured to carry the substrate and a transport device configured to dispose a chip onto the substrate. The transport device includes a bond head including a bond base and an attaching element including an edge area surrounding a center area and a plurality of vacuum holes located at the edge area. The attaching element is disposed on the bond base and configured to allow the chip to be attached thereon. The chip-stacking apparatus also includes a vacuum pump coupled with the bond head and configure to make the bond head having a suction force via the vacuum holes. The suction force of the bond head at the edge area is stronger than that of the center area.

In some embodiments, a chip-stacking apparatus is provided. The chip-stacking apparatus includes a first cleaning device configured to clean a substrate and a second cleaning device configured to clean a chip. The chip-stacking apparatus also includes a chip-stacking device configured to stack the chip on the substrate, and an alignment device configured to checking an offset between the chip and the substrate when the chip is stacked on the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip-stacking apparatus for stacking a chip on a substrate, comprising:
    a substrate support configured to carry the substrate, and
    a transport device configured to transport a chip onto the substrate, wherein the transport device comprises a bond head comprising:
        a bond base;
        an attaching element, mounted to the bond base, configured to attract the chip by a suction force, wherein a center area of the attaching element is higher than an edge area of the attaching element relative to the bond base; and
        a pushing element disposed on the attaching element and located at a center area of the attaching element, wherein the pushing element is movable with respect to the attaching element for pushing the center area of the chip.

2. The chip-stacking apparatus as claimed in claim 1, wherein the attaching element has a warped surface, and the chip is warped along the attaching surface when the chip is attached to the attaching element.

3. The chip-stacking apparatus as claimed in claim 2, wherein the attaching element comprises an edge wall and a center wall disposed on the bond base, the edge wall is around the center wall, wherein the top surfaces of the edge wall and the center wall are a part of the warped surface.

4. The chip-stacking apparatus as claimed in claim 1, wherein the transport device further comprises a vacuum pump coupled with the bond head, and the bond head generates the suction force to the chip by the vacuum pump.

5. The chip-stacking apparatus as claimed in claim 4, wherein the attaching element has a vacuum hole located at the center area, and the bond head attracts the chip using the suction force via the vacuum hole.

6. The chip-stacking apparatus as claimed in claim 4, wherein the attaching element has a plurality of vacuum holes located at the edge area, and the bond head attracts the chip using the suction force via the vacuum holes.

7. The chip-stacking apparatus as claimed in claim 1, wherein the transport device further comprises a transport mechanism configured to move the bond head with the chip toward the substrate.

8. A chip-stacking apparatus for stacking a chip on a substrate, comprising:
    a substrate support configured to carry the substrate;
    a transport device configured to dispose a chip onto the substrate, wherein the transport device comprises a bond head comprising:
        a bond base; and
        an attaching element, comprising an edge area surrounding a center area and a plurality of vacuum holes located at the edge area, disposed on the bond base and configured to allow the chip to be attached thereon; and
        a pushing element disposed on the attaching element and located at a center area of the attaching element, wherein the pushing element is movable with respect to the attaching element for pushing the center area of the chip; and
    a vacuum pump, coupled with the bond head, configured to make the bond head having a suction force via the vacuum holes,
    wherein the suction force of the bond head at the edge area is stronger than that of the center area.

9. The chip-stacking apparatus as claimed in claim 8, wherein the attaching element comprises an attaching surface configured to allow the chip to be attached thereon, and the attaching surface is a flat surface.

10. The chip-stacking apparatus as claimed in claim 9, wherein the center of the chip is separated from the attaching surface when the edge of the chip is attached to the attaching surface.

11. The chip-stacking apparatus as claimed in claim 8, wherein the attaching element comprises an attaching surface, and the attaching surface is a warped surface which allows the chip warped along the warped surface when the chip is attached on the attaching element.

12. The chip-stacking apparatus as claimed in claim 8, wherein the transport device further comprises a transport mechanism configured to move the bond head with the chip toward the substrate.

13. A chip-stacking apparatus, comprising:
    a first cleaning device configured to clean a substrate;
    a second cleaning device configured to clean a chip;
    a chip-stacking device configured to stack the chip on the substrate; and an alignment device configured to checking an offset between the chip and the substrate when the chip is stacked on the substrate, wherein the alignment device comprises:
- a transport device;
- an image sensor disposed on the transport device and configured to capture an image of the chip and the substrate when the chip is stacked on the substrate, and generate an image signal; and
- a processor configured to determine the offset between the chip and the substrate according to the image signal.

14. The chip-stacking apparatus as claimed in claim 13, wherein the first cleaning device further comprises a first dry-cleaning device configured to clean the substrate using plasma or gas, and a first wet-cleaning device configured to clean the substrate using liquid.

15. The chip-stacking apparatus as claimed in claim 13, wherein the second cleaning device further comprises a second dry-cleaning device configured to clean the chip by plasma or gas and a second wet-cleaning device configured to clean the chip using liquid.

16. The chip-stacking apparatus as claimed in claim 13, wherein the chip-stacking device further comprises a transport device configured to transfer the chip onto the substrate, wherein the transport device comprises a bond head comprising:
- a bond base; and
- an attaching element, disposed on the bond base, configured to allow the chip to be attached thereon; and
- a pushing element disposed on the attaching element and located at a center area of the attaching element, wherein the pushing element is movable with respect to the attaching element for pushing the center area of the chip.

17. The chip-stacking apparatus as claimed in claim 16, wherein the attaching element has a warped surface, and the chip is warped along the attaching surface when the chip is attached to the attaching element.

18. The chip-stacking apparatus as claimed in claim 16, further comprising a chip-cleaning device configured to clean the chip when the chip is attached to the bond head.

19. The chip-stacking apparatus as claimed in claim 13, further comprising a debonding device configured to separate the chip from the substrate if the chip is not aligned with the substrate.

* * * * *